United States Patent [19]
Bouix et al.

[11] Patent Number: 5,048,456
[45] Date of Patent: Sep. 17, 1991

[54] DEVICE FOR CONTINUOUSLY COATING A CARBON FIBER FABRIC WITH A CARBIDE-BASED PASSIVATING PROTECTIVE LAYER

[75] Inventors: Jean Bouix, Lyons; Hervé Mourichoux, Villeurbanne; Christiane F. Vincent; Henri J. Vincent, both of Lyons, all of France

[73] Assignee: Centre National de la Recherche Scientifique, France

[21] Appl. No.: 502,524

[22] Filed: Mar. 30, 1990

[30] Foreign Application Priority Data

Apr. 4, 1989 [FR] France ............................. 89 04650

[51] Int. Cl.$^5$ ............................................. C23C 16/00
[52] U.S. Cl. ........................................ 118/718; 118/725
[58] Field of Search ........................ 118/718, 719, 725

[56] References Cited

U.S. PATENT DOCUMENTS

| | | | |
|---|---|---|---|
| 2,877,138 | 3/1959 | Vodonik | 118/718 |
| 2,879,739 | 3/1959 | Bugbee | 118/718 |
| 3,572,286 | 3/1971 | Forney | 118/718 |
| 3,780,255 | 12/1973 | Boom | 118/718 |
| 4,263,336 | 4/1981 | Thompson et al. | 427/45.1 |
| 4,859,503 | 8/1989 | Bouix | 427/249 |

FOREIGN PATENT DOCUMENTS 3424166 8/1984 Fed. Rep. of Germany .
2607840 6/1988 France .

*Primary Examiner*—Richard Bueker
*Attorney, Agent, or Firm*—Wall and Roehrig

[57] ABSTRACT

Improved device for continuously coating a carbon fiber fabric or similar with a carbide-based passivating protective layer, comprising:
 a leakproof and corrosion-resistant enclosure;
 a set of unwinding (3) and winding-up (1) pulleys respectively;
 a member (2, 4) capable of keeping the fabric under a slight positive tension;
 and a means (7) for heating the fabric traveling through (10),
which device additionally comprises, between the two pulleys (1, 3), a reactor through which the fabric and a reaction gas mixture travel (10) countercurrentwise, consisting of a first hollow elongate component (5) capable of surrounding the fabric traveling through and made of a material which is inert toward the reaction gas mixture, and of a second hollow elongate component (6) coaxial with the said first component (5).
Applications: composite materials, lightweight alloys, aeronautics, automobile industries, and the like.

6 Claims, 1 Drawing Sheet

DEVICE FOR CONTINUOUSLY COATING A CARBON FIBER FABRIC WITH A CARBIDE-BASED PASSIVATING PROTECTIVE LAYER

BACKGROUND OF THE INVENTION

The present invention relates to an improved device for continuously coating a carbon fiber fabric or similar with a passivating protective layer based on a carbide.

A process and a device capable of permitting the continuous coating of carbon filament yarns and strands has been described in French Patent FR-A-2,607,840. This process is based on the development of a carbide layer involving a chemical reaction with the carbon of the filaments and a gaseous phase not containing any gaseous carbon compounds, thus making it possible to obtain strands exhibiting a better resistance both to oxidation and to the action of metals at high temperature. This deposition process, better known by the expression "reactive CVD" or "RCVD" (Reactive Chemical Vapor Deposition), remains limited, however, the substrate being in one-dimensional form, strands in this case.

In fact, one of the stages of this process calls for direct heating of the fibers by the application of electrical voltage. Consequently, the process and therefore the device for its implementation cannot be employed in the case of two- or three-dimensional structures such as tapes, fabrics or the like, because they would involve a high voltage and consequently would require high-powered electrical equipment, incompatible with a rational and profitable industrial plant, and which would furthermore severely jeopardize safety, especially of personnel.

The present invention is aimed at overcoming these disadvantages. It proposes a device capable of permitting the continuous treatment of fabrics or similar, that is to say of two- or three-dimensional structures, by gas phase deposition of a carbide-based passivating protective layer.

SUMMARY OF THE INVENTION

This improved device comprises:

a leakproof and corrosion-resistant enclosure equipped at one of its ends with a delivery orifice for the reaction gas mixture comprising, on the one hand, hydrogen and, on the other hand, a volatile compound capable of yielding a refractory carbide, and at the other end an outlet orifice for the gases which have reacted;

a set of unwinding and winding-up pulleys respectively, which are placed in the said enclosure and capable of making the fabric travel through;

a member capable of keeping the fabric under a slight positive tension;

and a means for heating the fabric which travels through.

The present invention is characterized in that the device additionally comprises, between the two pulleys, a reactor through which the fabric and the reaction gas mixture travel countercurrentwise, consisting of a first hollow elongate component capable of surrounding the fabric traveling through and made of a material which is inert toward the reaction gas mixture, and of a second hollow elongate component coaxial with the said first component.

In other words, the present invention consists in equipping a device for continuous treatment by the so-called "RCVD" method with a particular reactor consisting in fact of two coaxial components intended to permit the treatment of two- or three-dimensional fabrics.

Advantageously, in practice:

the unwinding roller is mounted idle in rotation, while the winding-up roller is a drive;

the fabric to be treated is unwound and wound up flat by passing over tensioning devices;

the two components forming the reactor are coaxial and parallelepipedal or cylindrical, depending on the dimensions of the fabric to be treated;

the first component of the reactor forms a susceptor and is made of graphite passivated beforehand with the reaction gas mixture;

the second component of the reactor is resistant to heat and to corrosion and is made of a material chosen from the group consisting of silica and alumina.

BRIEF DESCRIPTION OF THE DRAWINGS

The way in which the invention may be implemented and the advantages which stem therefrom will become clearer from the example of embodiment which follows, given by way of guidance but without any limitation, in support of the attached figures, in which.

DESCRIPTION OF THE INVENTION

Figure 1:
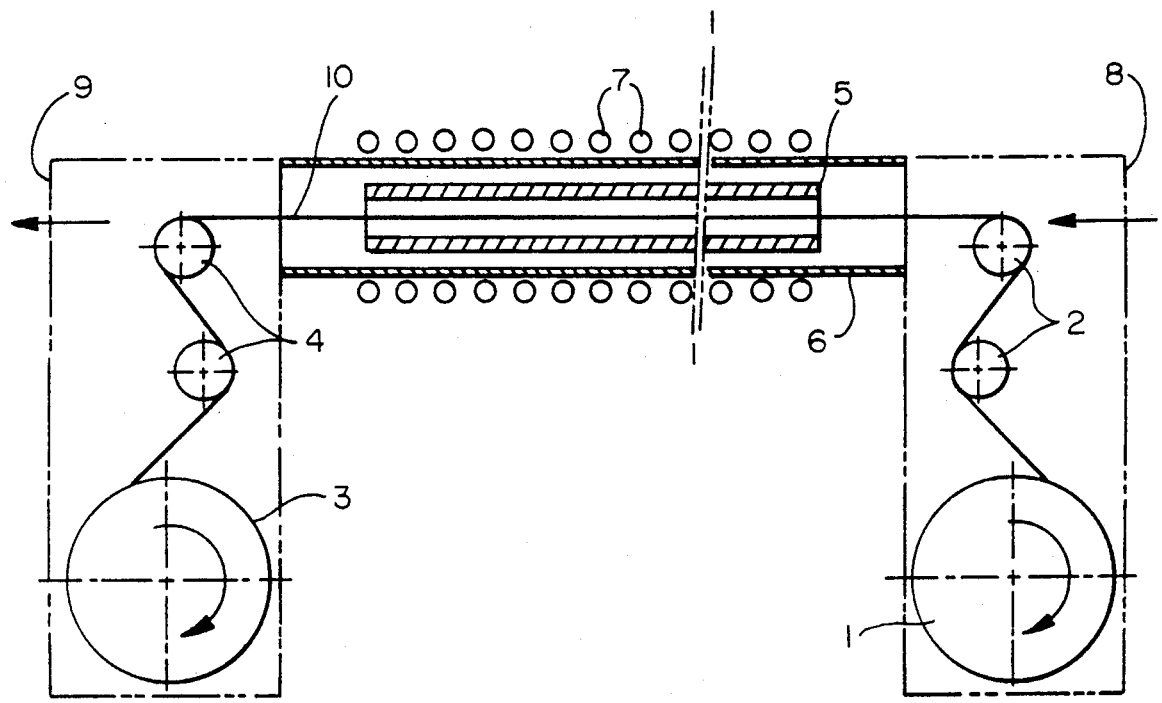
FIG. 1 is a view of the device in accordance with the invention in lengthwise section.
Figure 2:
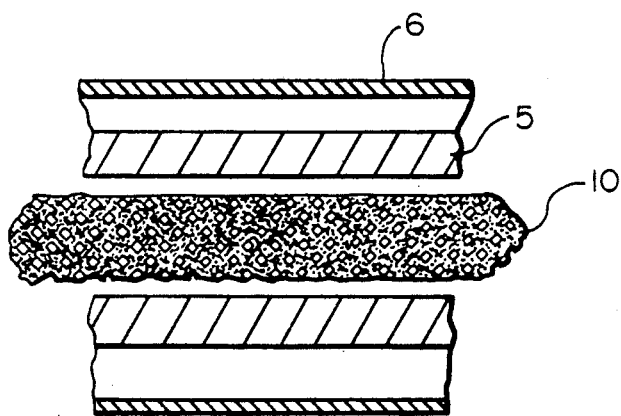
FIG. 2 is a cross-section along line I—I of FIG. 1.

The example which follows relates to the treatment of a fabric which is in the form of a cylindrical knit one centimeter in diameter, consisting of 36 strands each of 2,000 unit filaments. However, it is obvious that the device in accordance with the present invention is completely capable of being adapted to the treatment of two- or three-dimensional textile components, that is to say of carbon fiber fabrics comprising two of its dimensions, the width and the length respectively, which are predominant relative to the third dimension, the thickness in this case. In this way, this device is wholly applicable to the treatment of fabrics, knits, grids, plaits, gauzes, tapes, as well as sewn knits.

In accordance with the invention, the treatment enclosure comprises a reactor consisting of a first hollow and elongate component (5), called susceptor, and of a second component (6), coaxial and external in relation to the latter. The said second component (6) is advantageously made of silica or even of alumina, in order to be capable of effectively resisting heat and corrosion.

In the case of the example described, the susceptor (5) is of a cylindrical shape whose inner diameter is fourteen millimeters and whose length is equal to forty centimeters. It is made of graphite.

The susceptor (5) and the said second component (6) of which the reactor is made up are conveniently coaxial and parallelepipedal, especially in the case of treatment of fabrics of large sizes.

The susceptor (5) is then passivated, that is to say made chemically inert toward the gaseous reactants employed by RCVD, by treatment with the appropriate gaseous mixture for a period of approximately two days. Depending on the nature of the carbide deposited on the fabric to be treated (10), chosen chiefly from the group consisting of silicon carbide (SiC), titanium carbide (TiC), or even boron carbide ($B_4C$), the appropriate mixture then consists of SiCl$_4$—H$_2$, of TiCl$_4$—H$_2$ or of BCl$_3$—H$_2$ respectively, and this at a temperature of 1500° C.

The susceptor (5) is chiefly intended to concentrate the heat generated by a heating device (7) in the region of the fabric (10) traveling through.

Before deposition of the carbide-based passivating protective layer onto the fabric, the latter is subjected beforehand to a desizing stage consisting, in a wholly conventional manner, of heating to 800° C. under vacuum.

The stage of actually forming the carbide passivating layer on the fabric (10) is then undertaken. The fabric (10) is stored beforehand on an unwinding reel (3) mounted idle in rotation. It is unwound flat by passing over tensioning devices (4) and then through the reactor consisting, respectively, of the susceptor (5) and the outer wall of the actual reactor (6).

After passing through the reactor, the fabric is recovered flat by tensioning devices (2) and is then wound up onto a take-up reel (1) which is itself a drive.

The speed of travel is of the order of 0.5 meters/hour. In this way, the period of contact between the fabric and the gaseous reaction mixture passing through the reactor is of the order of twenty minutes. In fact, this contact time is adjusted as a function of the gas flow rates and of the speed of travel of the fabric in the reactor.

The gaseous reaction mixture enters the reactor through a delivery orifice (8) at atmospheric pressure, and travels countercurrentwise to the fabric in the reactor. The gases which have reacted leave the enclosure through an outlet orifice (9).

The reactor enclosure is heated by high frequency induction by means of the windings (7). The latter surround the reactor (6), especially in the region of the susceptor (5). The temperature of the enclosure is systematically raised above 1000° C., the choice of the latter being dictated by the nature of the desired coating.

In the case of the formation of a silicon carbide passivating layer, a mixture consisting of hydrogen, silicon chloride (SiCl$_4$) and argon is introduced into the reactor. The respective flow rates of each of these three gases are 225 cm$^3$/min, 100 cm$^3$/min and 650 cm$^3$/min. Throughout the period of treatment, the fabric is kept under a slight positive tension by means of the tensioning devices (2, 4) and unwinding and winding-up pulleys (1, 3), this being in order to avoid any floating. The temperature of the susceptor (5) is kept above or equal to 1500° C.

In the case of the formation of a titanium carbide passivating layer, a reaction gas mixture is introduced consisting of hydrogen at a flow rate of 2,400 cm$^3$/min and titanium chloride (TiCl$_4$) at a flow rate of the order of 40 cm$^3$/min respectively. The temperature of the susceptor is kept above or equal to 1100° C.

In the case of the formation of a boron carbide (B$_4$C) passivating layer, a reaction mixture is introduced into the enclosure, consisting, on the one hand, of hydrogen at a flow rate of 75 cm$^3$/min and of boron chloride (BCl$_3$) at a flow rate of 50 cm$^3$/min. The temperature of the susceptor is kept above or equal to 1300° C.

In this way, a fabric is obtained in which the characterization techniques, especially X-ray diffraction, show that the coating of the plait of which the carbide-treated fabric is made up is slightly crystalline. X-ray imaging and electron scanning microscopy show that the coating is uniform; in fact, it has not been possible to detect any shadowing or welding effect, including the region where the fibers cross. This coating thus matches the initial form of the filaments of which the plait is made up. The fabric consequently conserves its initial suppleness. Chemical analysis makes it possible to determine the thickness of the layer at approximately fifty nanometers.

In the case of dimensions which are sufficiently large relative to the dimensions of the reactor, the susceptor (5) is not necessary. In fact, substantially equivalent results are observed in this case, according to whether a susceptor is employed or not.

In this way, the device in accordance with the invention makes it possible to treat fabrics made of carbon fibers at rates which are greatly increased in relation to the devices known hitherto, in which the treatment of two- or three-dimensional fabrics was not possible. As a result, the fabrics thus treated can have many applications, especially in the development of composite materials or of lightweight alloys or ceramics. Thus, these treated fabrics can be employed successfully in the aeronautics, space, nuclear or automobile industries, and the like.

We claim:

1. Apparatus for continuously coating carbon filaments of a continuous multi-filament fabric with a carbide-based passivation layer that includes a reactor means having an elongated hollow inner member formed of a material that will not react with a gas selected from the group of SiCl$_4$—H$_2$, TiCl$_4$—H$_2$, and BCl$_3$—H$_2$, and an elongated hollow outer member surrounding said first member, said outer member being formed of a non-corrosive material that is capable of retaining heat within said reactor means, flow means for passing a reaction gas in a first direction through said inner member, said reaction gas containing a volatile compound capable of reacting with said carbon filaments to form a carbide passivation layer upon each of said filaments, first means for supplying a fabric to be passivated, drive means for drawing said continuous fabric through said inner member under tension in a direction opposite that of said reaction gas, and second means for receiving fabric from said drive means and storing said fabric, induction means for heating said inner member and fabric positioned within said inner member to a temperature at which the gas reacts with the filaments of the fabric to form a carbide passivation layer upon each filament.

2. The apparatus of claim 1 wherein said drive means further includes pulley means positioned outside the reaction means for tensioning the fabric as it moves through said first member.

3. The apparatus of claim 1 wherein said heating means further includes a high frequency coil for heating said inner member and fabric to a desired temperature.

4. The apparatus of claim 1 wherein said inner member is a susceptor formed of graphite having an outer passivation layer formed by heating the member in the presence of a reaction gas selected from the group of SiCl$_4$—H$_2$, TiCl$_4$—H$_2$, and BCl$_3$—H$_2$ until said susceptor is unreactive with said gas.

5. The apparatus of claim 1 wherein the outer member is formed of silica or alumina.

6. The apparatus of claim 4 wherein the susceptor is cylindrical in form and is arranged to concentrate its heat about the fabric moving therethrough.

* * * * *